United States Patent [19]

Dingwall

[11] Patent Number: 4,988,902
[45] Date of Patent: Jan. 29, 1991

[54] SEMICONDUCTOR TRANSMISSION GATE WITH CAPACITANCE COMPENSATION

[75] Inventor: Andrew G. F. Dingwall, Bridgewater, N.J.

[73] Assignee: Harris Corporation, Melbourne, Fla.

[21] Appl. No.: 356,086

[22] Filed: May 24, 1989

[51] Int. Cl.$^5$ ............................................. H03K 17/16
[52] U.S. Cl. .................................. 307/572; 307/246; 307/303.2; 307/579; 307/585
[58] Field of Search ................ 307/443, 246, 571–572, 307/577, 579, 584–585, 303

[56] References Cited

U.S. PATENT DOCUMENTS

| | | | |
|---|---|---|---|
| 4,467,227 | 8/1984 | Lewyn et al. | 307/577 |
| 4,473,761 | 9/1984 | Peterson | 307/579 |
| 4,511,814 | 4/1985 | Matsuo et al. | 307/572 |
| 4,551,634 | 11/1985 | Takahashi et al. | 307/571 X |
| 4,590,396 | 5/1986 | Koike | 307/572 |
| 4,599,522 | 7/1986 | Matsuo et al. | 307/579 X |
| 4,651,037 | 3/1987 | Ogasawara et al. | 307/572 |

FOREIGN PATENT DOCUMENTS 0093325  7/1980  Japan ............................ 307/571

*Primary Examiner*—David Hudspeth
*Attorney, Agent, or Firm*—Henry I. Schanzer

[57] ABSTRACT

A transmission gate employs a pair of capacitors ahead of and a pair of capacitors behind a transistor. One capacitor of each pair is supplied with a control voltage pulse that leads and the other with a control voltage pulse that lags the complement of a control voltage pulse supplied to the gate of the transistor. The capacitors are typically each a MOS transistor with the gate serving as one terminal and the drain and source shorted together and serving as the other terminal. Moreover, each of the capacitors has a capacitance equal to one half the capacitance of the gate to source and gate to drain capacitance of the transistor. This circuitry makes possible charge compensation to avoid the build up of trapped charge in the transistor. The capacitance of the pair of capacitors ahead of the transistor is approximately equal to the gate-to-drain parasitic of the transistor and the capacitance of the pair of capacitors behind the transistor is equal to the parasitic capacitance of the gate-to-source of the transistor.

42 Claims, 3 Drawing Sheets

SEMICONDUCTOR TRANSMISSION GATE WITH CAPACITANCE COMPENSATION

FIELD OF THE INVENTION

This invention relates to semiconductor circuits and more particularly to a semiconductor circuits useful as a transmission gates.

BACKGROUND OF THE INVENTION

A transmission gate is a circuit element that is inserted serially in a transmission path for controlling transmission therepast. Essentially it is a circuit that includes a switch serially coupled in the transmission path that can be either open, i.e., a high impedance, or closed, i.e., a low impedance or short.

Transmission gates typically employ a metal-oxide-semiconductor (MOS) transistor as the switch. In such an application the source-drain path of the MOS transistor is in the transmission path and a control signal applied to the gate electrode serves to switch this path between a high (when the transistor is turned off) and a low (when the transistor is turned on) impedance state.

However, it is a characteristic of a MOS transistor that it has a first parasitic capacitor between the gate and source and a second parasitic capacitor between the and gate and drain that serve to shunt signal charge both when the transistor is being turned on and again when it is being turned off. Such capacitive shunting serves to slow the onset of the high impedance state when the transistor is turned off and the onset of the low impedance state when the transistor is turned on. Additionally, charge injected by a control pulse applied to the gate of the transistor can be trapped at the output terminal (which is typically coupled to a high impedance load). At high switching speeds, this trapped charge can reduce the rate of transition to the high impedance state of the switch. To minimize this charge pumping, the usual practice hitherto has been to associate the transistor with a pair of dummy transistors used as two terminal capacitors through which a partially compensating inverse charge is injected (see FIG. 1). Still further, the charge injected can change the voltage levels of signals being transmitted through the transmission gate and can thus degrade the accuracy of these signals. These problems are particularly of interest in some analog-to-digital converters which require high accuracy input signals.

Referring now to FIG. 1, there is shown a transmission gate 10 which includes n-channel MOS transistors 12, 14 and 16 and first and second inverters 18 and 20. Inverter 18 is used as a buffer and is optional. Transmission gate 10 controls a transmission path from a terminal 22, which is coupled to the drain and source of transistor 14 and to the drain of transistor 12, to a terminal 24 which is coupled to the drain and source of transistor 16 and to the source of transistor 12.

An output terminal of an n-channel transistor is generally denoted as the drain if positive current flows into same and passes through the channel of the transistor and exits at the other output terminal which is denoted as the source. If the direction of current flow through the transistor reverses, the drain and source designations of the output terminals reverse.

An output terminal of a p-channel transistor is generally denoted as the source if positive current flows into same and passes through the channel of the transistor and exits at the other output terminal which is denoted as the drain. If the direction of current flow through the transistor reverses, the drain and source designations of the output terminals reverse.

A control signal input terminal 26 is coupled to an input of inverter 20. An output of inverter 18 is coupled to an input of inverter 20, to the gate of transistor 12 and to a terminal 28. An output of inverter 20 is coupled to the gates of transistors 14 and 16 and to a terminal 30. A first conductor 32 shorts the drain and source of transistor 14 together and a second conductor 34 shorts the drain and source of transistor 16 together. Transistors 14 and 16, with their drains and sources shorted together, act as capacitors and as such may be denoted as capacitors 14 and 16 with the gate of each serving as a first capacitor terminal and the source and drain of each serving as a second capacitor terminal. Capacitors Cgs and Cgd, shown in dashed lines, are the parasitic gate to source capacitance and gate to drain capacitance of transistor 12. Cgs and Cgd are typically equal because of the symmetrical structure of the typical MOS transistor.

The dimensions of transistors 14 and 16 are typically selected to be identical to those of transistor 12 except that the channel width of each is typically one-half of that of the channel width of transistor 12. This to a large order makes the capacitance of each of transistors 14 and 16 equal to Cgs and Cgd, respectively.

During operation a control voltage pulse (not shown in FIG. 1) is applied to terminal 26 and same is inverted by inverter 18 and then by inverter 20. This voltage pulse serves to turn on and turn off transistor 12. In doing so charge is injected via Cgs and Cgd to terminals 22 and 24, respectively. This injected charge can change the potential of terminals 22 and 24 which can in some applications modify and/or degrade information being transmitted through transmission gate 10. The trapped charge is a function of the rate of transition of the transistor to the high impedance state of transmission gate 10.

In operation, the capacitors 14 and 16 are designed to provide approximate charge compensation to the transistor 12 for capacitive coupled current flowing therein by supplying or withdrawing and appropriate equal amount of capacitive coupled charge to terminals 22 and 24, respectively.

However, for good compensation, it is necessary that the control voltage pulse applied to the gate (terminal 28) of the transistor 12 be exactly equal in amplitude and opposite in phase to the control voltage pulse applied to the gates (terminal 30) of capacitors 14 and 16. In practice it is difficult to achieve perfect compensation due to several effects but primarily because it is difficult to get the phases exactly opposite. In particular, any time delay introduced in the control voltage pulse by inverter 20 causes an error in achieving exactly a 180 degree phase difference. Failure to get perfect compensation can result in undesirable charge buildup in the transistor 12 when it is turned off. It can also change the potential of terminals 22 and 24 when transistor 12 is turned on but this injected charge is usually dissipated to a low output impedance signal source (not shown) coupled to terminal 22.

Referring now to FIG. 2, there are graphically shown voltage waveforms A (solid line) and B (dashed line) appearing at the gate (terminal 28) and the gates (terminal 30) of transistors 14 and 16, respectively, with the x-axis being time T (nano-seconds) and the y-axis being voltage V (volts). Waveform A leads waveform B because of a delay introduced by inverter 20.

Referring now to FIG. 3, there is graphically shown a current varying waveform appearing on terminal 24 with the x-axis being time T (nano-seconds) and the y-axis being charge Q (coulombs). The time scales of FIG.'s 2 and 3 are essentially identical.

For the case depicted, the transistor 12 is turned on before the transistors 14 and 16 are turned off. As a result, extra charge is injected at the source/gate and drain/gate capacitances and it is trapped in the source capacitance of the transistor 12 once transistor 12 is off. This results in the positive offset voltage between T=t3 and T=t4 of FIG. 3.

In the opposite case (not depicted) where the control pulse to the gates of transistor 14 and 16 leads, charge injected from these transistors "bleeds" back to a signal source (not shown) since the transmission gate 10 is still on (transistor 12 is turned on). The result is that excess charge is injected by Cgs and Cgd into terminals 22 and 24 where it is trapped since the conductance of the transmission gate lo goes to zero before the signal applied to the gate of transistor 12 (terminal 28) reaches its off level, a "0".

Another problem with circuitry lo is that it is difficult to dynamically match the capacitance of the n-channel transistors used as capacitors with the Cgd and Cgs parasitic capacitances when an MOS transistor is enabled (biased on) it's Cgd and Cgs are greater than when it is disabled (biased off). Circuitry 10 uses opposite logical level signals to control the n-channel transistors. This means that during portions of the operation that one n-channel transistor is enabled and the other two are disabled and during other portions of the operation the reverse is true. It is thus difficult to match capacitances as closely as may be desired in some applications.

It is desirable to have an MOS transistor transmission gate which has better compensation for injected charge than the transmission gate 10 of FIG. 1.

SUMMARY OF THE INVENTION

The present invention is directed to circuitry which is useful as a transmission gate. The circuitry comprises a first MOS transistor of the one conductivity type and having a gate-to-source (Cgs) parasitic capacitance and a gate-to-drain (Cgd) parasitic capacitance, four capacitors and two inverters. A first circuitry input/output terminal is coupled to the drain of the transistor and to first terminals of first and second capacitors. A second circuitry input/output terminal is coupled to the source of the transistor and to first terminals of the third and fourth capacitors. An input terminal of the first inverter is coupled to second terminals of the first and third capacitors. An output terminal of the first inverter is coupled to the gate of the transistor and to an input of the second inverter. An output of the second inverter is coupled to second terminals of the second and fourth capacitors. The capacitances of the first and second capacitors are each approximately one-half of the capacitance of Cgd and the capacitances of the third and fourth capacitors are each approximately one-half of the capacitance of Cgd.

In a preferred embodiment each of the capacitors is a separate MOS transistor with the source and drain being coupled together and serving as a first terminal of the capacitor and the gate serving as the second terminal of the capacitor.

The present invention improves on the standard compensation technique described above by using time-averaged compensation to reduce the criticality of the phase of the supplied compensation charge. To this end, there is associated with each of Cgs and Cgd a separate pair of capacitors each having a capacitance essentially half that of the associated parasitic capacitance. The two capacitors of each pair are gated by control voltage pulses appropriately so that one of each pair is gated slightly ahead of the gating of the transistor and the other of each pair is gated slightly behind the gating of the transistor. A string of inverters supplied with the control voltage pulses is tapped appropriately to provide desired leading and lagging control pulses symmetric about a control voltage pulse applied to the transistor. In this way, time averaged compensating charges may be provided to avoid the build up of trapped charge in the transistor and limit the magnitude of injected charge and essentially eliminate offset voltages.

In another embodiment the present invention is directed to circuitry which is useful as a transmission gate. The circuitry comprises first, second and third field effect transistors each having a gate terminal and first and second output terminals and further comprises an inverter having an input and an output. The output terminals of the second transistor are coupled to the first output terminal of the first transistor and to a first input-/output circuitry terminal. The output terminals of the third transistor are coupled to the second output terminal of the first transistor and to a second input/output circuitry terminal. The input of the inverter is coupled to the gate terminal of the first transistor and to a control circuitry terminal. The output of the inverter is coupled to the gate terminals of the second and third transistors. The first transistor is of a first conductivity type and the second and third transistors of the opposite conductivity type.

The invention will be better understood from the following more detailed description taken in conjunction with the accompanying drawing.

DETAILED DESCRIPTION

Figure 4:
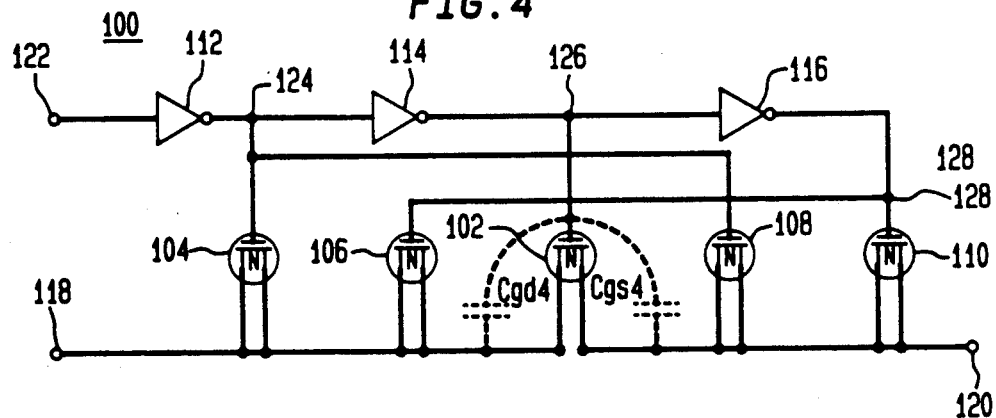
FIG. 4 is a circuit schematic of a transmission gate in accordance with one embodiment of the present invention.

Referring to FIG. 4, there is shown a transmission gate 100 in accordance with one embodiment of the present invention. Transmission gate 100 comprises an n-channel MOS transistor 102 (connected as a switch), n-channel MOS transistors 104, 106, 108, and 110 (each having its source shunted to its drain to serve as a two terminal capacitor in the manner described in connection with FIG. 1) and inverters 112 and 116. Since transistors 104, 106, 108 and 110 function as capacitors, same may be denoted as capacitors 104, 106, 108 and 110, respectively. Transmission gate 100 controls a transmission path from a terminal 118, which is coupled to the drain and source of each of transistors 104 and 106 and to the drain of transistor 102, to a terminal 120 which is coupled to the drain and source of each of transistors 108 and 110 and to the source of transistor 102. It is to be appreciated that all of the transistors can be p-channel MOS transistors and circuitry 100 is still fully functional.

A control signal input terminal is coupled to an input of inverter 112 and to a terminal 122. An output of inverter 112 is coupled to the gates of transistors 104 and 108, to an input of inverter 114 and to a terminal 124. An output of inverter 114 is coupled to the gate of transistor 102, to an input of inverter 116 and to a terminal 126. An output of inverter 116 is coupled to the gates of transistors 106 and 110 and to a terminal 128. Capacitors Cgs4 and Cgd4, shown in dashed lines, are the parasitic gate to source capacitance and gate to drain capacitance, respectively, of transistor 102. Cgs4 and Cgd4 are typically equal because of the symmetrical structure of the typical MOS transistor.

The dimensions of transistors 104, 106, 108 and 110 are typically selected to be identical to those of transistor 102 except that the channel width of each is one-quarter of that of the channel width of transistor 102. This to a large order makes the capacitance of each of transistors 104 and 106 equal to one-half of Cgd4 and the capacitance of each of transistors 108 and 110 equal to one-half of Cgs4.

For optimum compensation, it is advantageous that the sum of the capacitances of transistors 104 and 106 equals the capacitance of Cgs4 and the sum of the capacitances of transistors 108 and 110 equals the capacitance of Cgd4. This also results in the sum of the capacitances of transistors 104, 106, 108 and 110 equaling the sum of the capacitances of Cgs4 and Cgd4 if Cgd4 equals cgs44. Moreover, since Cgd4 and Cgs4 are essentially equal because of the symmetric design characteristic of the MOS transistors typical in integrated circuits, the desired relationships are readily achieved by making the width of the channels of each of the transistors 104, 106, 108 and 110, one-quarter the width of the channel of the transistor 102 and having all the transistors similar in all other design parameters In such an instance each of transistors 104, 106, 108 and 110 exhibits a capacitance equal to one half that of each Cgs4 or Cgd4 and the characteristics of all the transistors track well with temperature and load conditions.

Moreover, in accordance with a time-averaging feature of the invention, the supplying or withdrawing of compensation charge by capacitors 104 and 108 is made to lead slightly the withdrawing or supplying of charge stored in Cgd4 and Cgs4 while the supplying and withdrawing of the compensation charge by the capacitors 106 and 110 is made to lag slightly the withdrawing or supplying of charge in Cgs4 and Cgd4. Optimally the amount of lag and the amount of lead should be equal, but because of the time averaging effect, transmission gate 100 is relatively insensitive to small differences in the lag and lead relationship.

To achieve the desired lead and lag relationship, the control voltage pulse used for turning on and turning off transistor 102 is supplied as before initially to the input of a first inverter 112, that primarily serves as a buffer. Inverter 112 can be eliminated and a control voltage pulse is then applied directly to terminal 124.

It can be appreciated that a control voltage pulse supplied by the output of inverter 114 to the transistor 102 lags the control voltage pulse supplied by the output of inverter 112 to the gates of transistors 104 and 108 at least by the time delay it experiences in passing through inverter 114. Additionally, it leads the control voltage pulse supplied by the output of inverter 114 to the gates of the transistors 106 and 108 at least by the time delay it experiences in passing through inverter 116. If the inverters 114 and 116 are such as to introduce equal delays, the amounts of lag and lead can be essentially equal as is desired for optimum time averaging.

The performance of circuitry 100 can be improved by making transistors 104, 106,108 and 110 p-channel MOS transistors where transistor 102 is an n-channel MOS transistor or by making transistors 104, 106, 108 and 110 n-channel MOS transistors where transistor 102 is a p-channel MOS transistor. These combinations contribute to a more accurate matching of capacitances and thus to less net charge injection and therefore improved performance.

Figure 5:
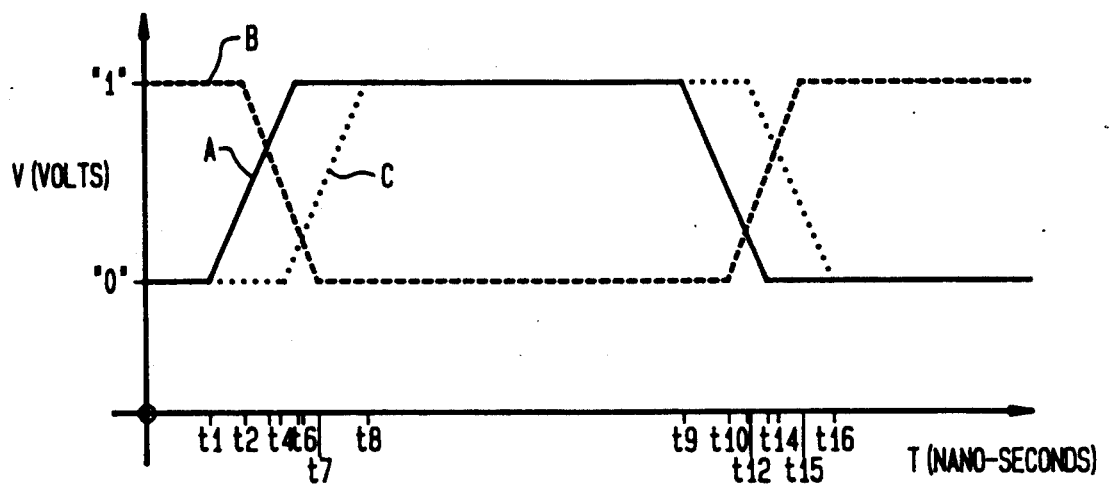
FIG. 5 depicts graphically the timing relationship of control voltage waveforms typical of the transmission gate of FIG. 4.

Referring to FIG. 5, there is graphically shown typical voltage waveforms A (shown as a solid line), B (shown as a dashed line) and C (shown as a dotted line) versus time which appear at the gates (terminal 124) of transistors 104 and 1080, the gate (terminal 126) of transistor 102 and the gates (terminal 128) of transistors 106 and 108, respectively, when a voltage pulse (not shown) having the opposite polarity of waveform A is applied to input control terminal 122. The y-axis is voltage V (volts) and the x-axis is time T (nano-seconds). Voltage waveform (pulse) A leads voltage waveform B by the delay introduced by inverter 114 and voltage waveform B leads voltage waveform C by the delay introduced by inverter 116.

Figure 6:
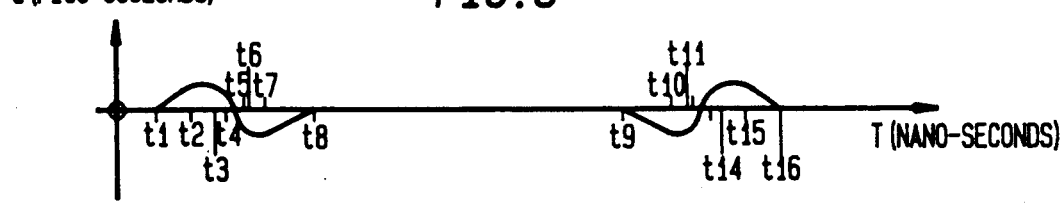
FIG. 6 depicts graphically the charge at the output of the transmission gate of FIG. 4 with respect to time.

Referring now to FIG. 6, there is graphically shown a typical charge waveform appearing on terminal 120 versus time given the voltage waveforms of FIG. 5 appearing on terminals 124, 126 and 128. The y-axis is charge Q (pico-coulombs) and the x-axis is time T (nano-seconds). Between T=t1 and t2 the charge builds up at terminal 120 as waveform A is coupled through capacitors 104 and 108 to terminals 118 and 120, respectively. From T=t2 to T=t4 waveform B2 decreases while waveform A2 continues to increase. Since the Cgd4 of transistor 102 is twice the capacitance of capacitor 108, the net effect on the charge on terminal 120 is to decrease somewhat over this time period. Between T=t4+ and T=t5— waveform B2 continues to decrease and the charge on terminal 120 rapidly decreases and becomes negative. Between T=t5+ and t7— waveform B2 is decreasing and waveform C2 is increasing. This slows the rate of decline of the charge on terminal 120. At T=t7+ waveform C2 continues to increase until T=t8. This causes the charge on terminal 120 to increase back to zero by T=t8. Between T=t8 and T9 waveforms A2, B2 and C2 stay flat and therefore the charge on terminal 120 remains essentially zero. At T=t9+ waveform A2 begins to decrease and continues to decrease until T=t12. This causes the charge on terminal 120 to rapidly increase until T=t10 at which time waveform B2 begins to increase. The net result is that between T=t10 and t12 that the rate of reduction of the charge on terminal 120 decreases. Waveform B2 continues to increase between T=t12 and t15. The charge on terminal 120 rapidly increase from a negative value to a positive value until T=t13. At T=t13 waveform C2 begins to decline and thus between T=t13 and t15 the charge on terminal 120 decrease of the charge of terminal 120 remains somewhat constant. Between T=t15+ to t16 waveform C2 continues to fall and thus the charge on terminal 120 rapidly drops and reaches essentially zero at about T=t16. The magnitudes of the positive and negative peaks of the charge on terminal 120 of transmission gate 100 are typically about only one half of that of charge on terminal 24 of transmission gate 10 of FIG. 1. In addition, there is no offset charge in transmission gate 100 as there is in transmission gate 10 of FIG. 1.

Figure 1:
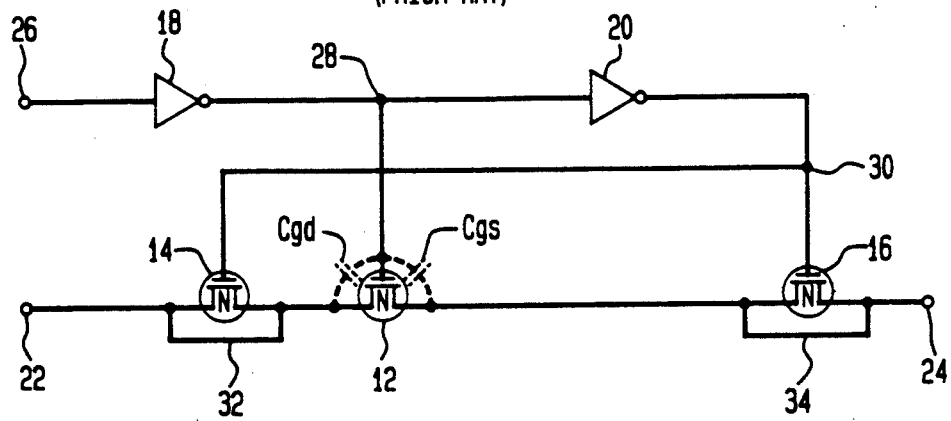
FIG. 1 is a circuit schematic of a prior art transmission gate which has been previously discussed.

Moreover, since in novel transmission gate 100 the last transistor to switch off is always the transistor 110, which is of one quarter size of transistor 102, the magnitude of the charge pulse injected is reduced relative to that of prior art transmission gate 10 of FIG. 1 in which the last transistor to switch off is either the full size transistor 12 or one of the half size transistors 14 or 16. Thus the magnitude of the error with time-averaged compensation is inherently reduced by at least half.

Figure 3:
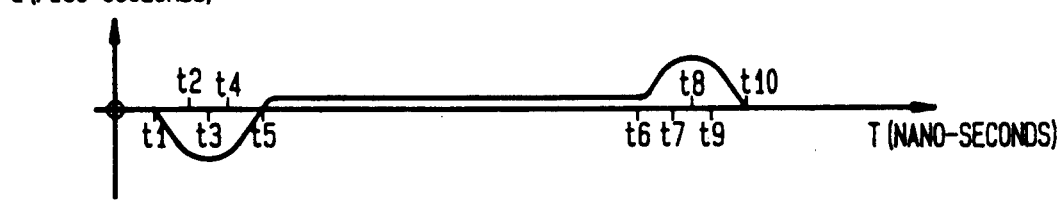
FIG. 3 depicts graphically the charge at the output of the transmission gate of FIG. 1 with respect to time.

Additionally, it can be shown that the total "glitch" energy represented by the charge pulses at the output represented by FIG. 6 in the gate 100 of the invention is considerably less than at the output in the prior art transmission gate 10 depicted in FIG. 3. This can be very important if the output signal is switched to amplifying or buffering stages, as in the output of a Analog to Digital Converter (ADC) where currents are typically switched by compensated gates.

Theoretically, it is possible to substitute for the various capacitors for a transistor with its source and drain connected together. However, the use of a transistor with the drain and source connected together makes for ease of manufacture of the transmission gate in integrated circuit form and is believed to be the form which will be most commonly used. It also results in a capacitor that tracks well with temperature and loading conditions the source-to-gate and drain-to-gate capacitances of the transistor 102.

It should be evident that a p-channel MOS can be used for the transistor 102. In such case, for ease of matching, p-channel transistors should also be used for the capacitors.

Figure 7:
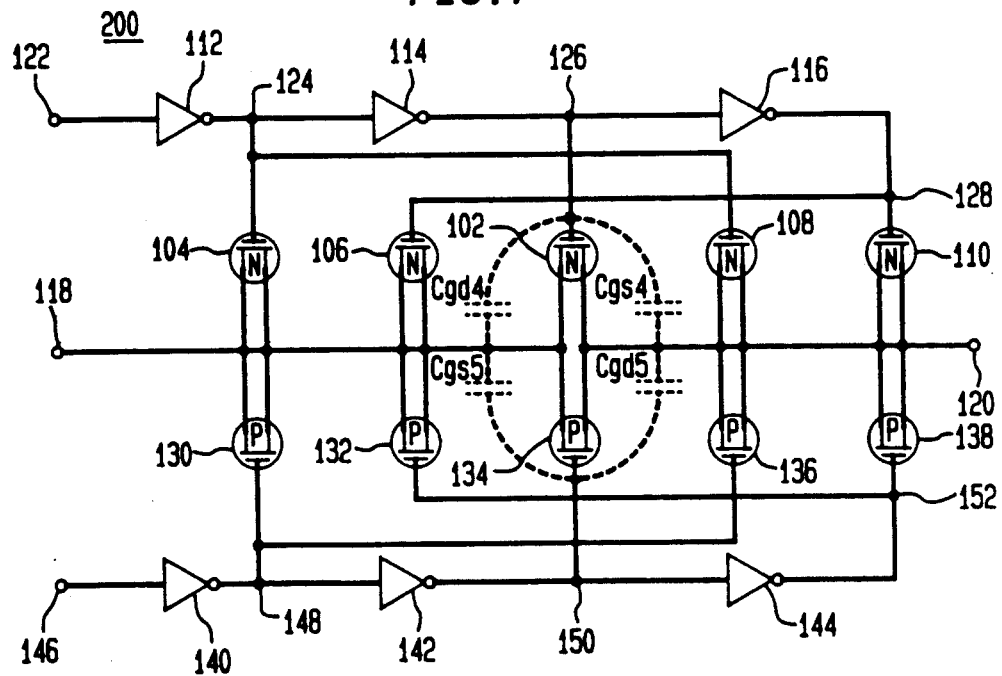
FIG. 7 is a circuit schematic of a transmission gate in accordance with another embodiment of the invention.
Figure 2:
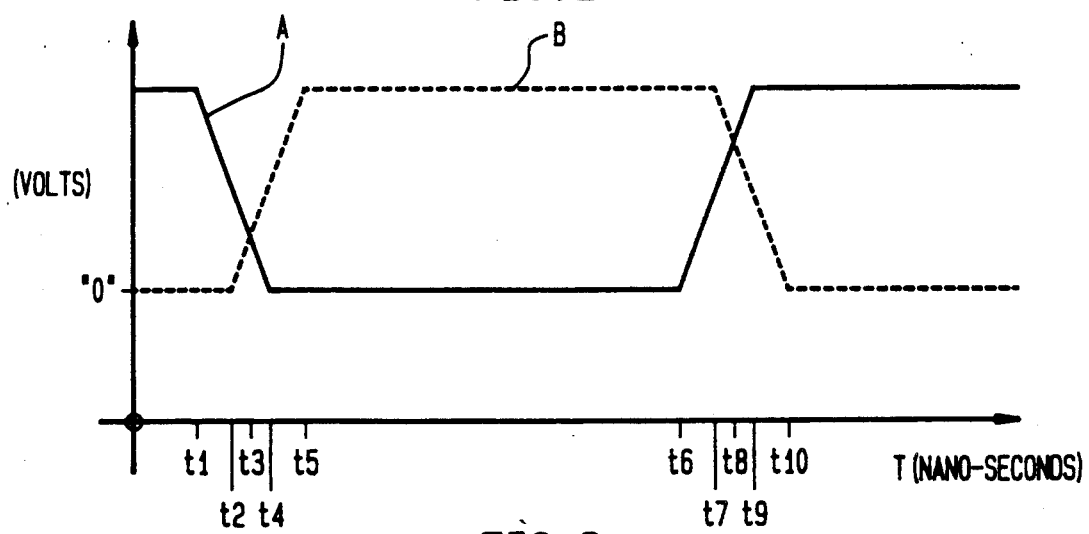
FIG. 2 depicts graphically the timing relationship of the waveforms of the control voltage waveforms typical of the transmission gate of FIG. 1.

Referring now to FIG. 7, there is shown a transmission gate 200 in accordance with another embodiment of the present invention. Transmission gate 200 is essentially identical to transmission gate 100 of FIG. 4 and in addition comprises p-channel transistors 130, 132, 134, 136 and 138 and inverter circuits 140, 142 and 144. Inverter 140 is used as a buffer and is optional Transmission gate 200 controls a bidirectional transmission path from a terminal 118 (which is coupled to the drain and source of each of transistors 104, 106, 130 and 132 and to the drain of transistor 102 and to the source of transistor 134) to a terminal 120 (which is coupled to the drain and source of each of transistors 108, 110, 136 and 138 and to the source of transistor 102 and to the drain of transistor 134). Each of the p-channel transistors and inverters associated therewith are configured essentially as the corresponding n-channel transistors and associated inverters and the combination thereof functions essentially the same as the transmission gate 100 of FIG. 4 except that the p-channel transistors need a "0" input signal to the gates thereof to be turned on whereas the n-channel transistors need a "1" gate signal. The use of both p-channel and n-channel transistors and the associated inverters allows transmission gate 200 to be bilateral which permits signals applied to terminal 118 or to terminal 120 to pass through transmission gate 200.

A second control signal input terminal is coupled to an input of inverter 140 and to a terminal 146. An output of inverter 140 is coupled to the gates of transistors 130 and 136, to an input of inverter 142 and to a terminal 148. An output of inverter 142 is coupled to the gate of transistor 134, to an input of inverter 144 and to a terminal 150. An output of inverter 144 is coupled to the gates of transistors 132 and 138 and to a terminal 152. Capacitors Cgs5 and Cgd5, shown in dashed lines, are the parasitic gate to source capacitance and gate to drain capacitance, respectively, of transistor 134. Cgs5 and Cgd5 are typically equal because of the symmetrical structure of the typical MOS transistor.

The dimensions of transistors 130, 132, 136 and 138 are typically selected to be identical to those of transistor 134 except that the channel width of each is one-quarter of that of the channel width of transistor 132. This to a large order makes the capacitance of each of transistors 130 and 132 equal to one-half of Cgs5 and the capacitance of each of transistors 136 and 138 equal to one-half of Cgd5.

For optimum compensation, it is advantageous that the sum of the capacitances of transistors 130 and 132 equals that of the capacitance of Cgs5 and the sum of the capacitances of transistors 136 and 138 equals that of the capacitance of Cgd5. This also results in the sum of the capacitances of transistors 130, 132 136 and 138 equaling the sum of the capacitances of Cgs5 and Cgd5. Moreover, since Cgs5 and Cgd5 are essentially equal because of the symmetric design characteristic of the MOS transistors typical in integrated circuits, the desired relationships are readily achieved by making the width of the channels of each of the transistors 130, 132, 136 and 138 one-quarter the width of the channel of the transistor 134 and having all the transistors similar in all other design parameters. In such an instance each of transistors 130, 132, 136 and 138 exhibits a capacitance equal to one half that of each Cgs5 or Cgd5 and the characteristics of all the transistors track well with temperature and load conditions.

Moreover, in accordance with a time-averaging feature of the invention, the supplying or withdrawing of compensation charge by transistors 130 and 132 is made to lead slightly the withdrawing or supplying of charge stored in Cgs5 and Cgd5 while the supplying and withdrawing of the compensation charge by the transistors 136 and 138 is made to lag slightly the withdrawing or supplying of charge in Cgs5 and Cgd5. Optimally the amount of lag and the amount of lead should be equal, but because of the time averaging effect, transmission gate 200 is relatively insensitive to small differences in the lag and lead relationship.

A first control voltage pulse is applied to terminal 122 and the complement thereof is applied to terminal 146. It is desirable that the first and second control voltage pulses be 180 degrees out of phase with no delay between them. All of the inverters are typically CMOS inverters which comprise the series combination of an n-channel and a p-channel MOS transistor with the gates couped together and acting as the input and the drains coupled together and acting as the output.

The performance of circuitry 200 can be improved by making transistors 104, 106, 108, 110 and 134 p-channel MOS transistors and making transistors 102, 130, 132, 136 and 138 n-channel MOS transistors. This combination contributes to a more accurate matching of capacitances and thus to less net charge injection and therefore improved performance.

Figure 8:
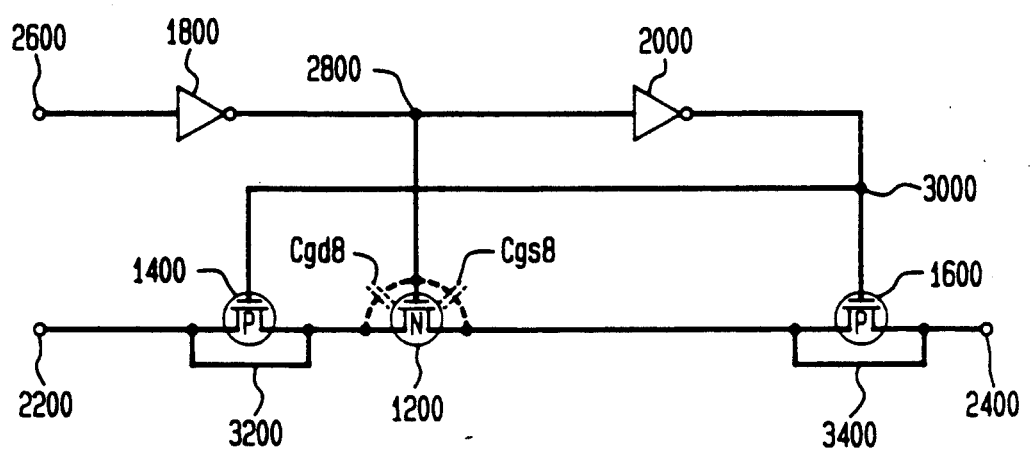
FIG. 8 is a circuit schematic of a transmission gate in accordance with another embodiment of the invention.

Referring now to FIG. 8, there is shown a transmission gate 800 which includes n-channel MOS transistor, p-channel MOS transistors 1400 and 1600 and first and second inverters 1800 and 2000. Inverter 1800 is used as a buffer and is optional. Transmission gate 8000 controls a transmission path from a terminal 2200, which is coupled to the drain and source of transistor 1400 and to the drain of transistor 1200, to a terminal 2400 which is coupled to the drain and source of transistor 1600 and to the source of transistor 1200. Transmission gate 800 is very similar to prior art transmission gate 10 of FIG. 1 except that the transistor 1200 is of opposite conductivity type of transistors 1400 and 1600. This is a signification in that it results in a more accurate capacitance matching of the capacitance of transistor 1400 to Cgd8 (the parasitic capacitance associated with the gate-drain of transistor 1200) and of the capacitance of transistor 1600 to Cgs8 (the parasitic capacitance of the gate-source transistor 1200).

A control signal input terminal 2600 is coupled to an input of inverter 2000. An output of inverter 1800 is coupled to an input of inverter 2000, to the gate of transistor 1200 and to a terminal 2800. An output of inverter 2000 is coupled to the gates of transistors 1400 and 1600 and to a terminal 3000. A first conductor 3200 shorts the drain and source of transistor 1400 together and a second conductor 3400 shorts the drain and source of transistor 1600 together. Transistors 1400 and 1600, with their drains and sources shorted together, act as capacitors and as such may be denoted as capacitors 1400 and 1600 with the gate of each serving as a first capacitor terminal and the source and drain of each serving as a second capacitor terminal. Capacitors Cgs8 and Cgd8, shown in dashed lines, are the parasitic gate to source capacitance and gate to drain capacitance of transistor 12. Cgs8 and Cgd8 are typically equal because of the symmetrical structure of the typical MOS transistor.

The dimensions of transistors 1400 and 1600 are typically selected to be identical to those of transistor 1200 except that the channel width of each is typically one-half of that of the channel width of transistor 1200. This to a large order makes the capacitance of each of transistors 1400 and 1600 equal to Cgs8 and Cgd8, respectively.

During operation a control voltage pulse (not shown in FIG. 8) is applied to terminal 2600 and same is inverted by inverter 1800 and then by inverter 2000. This voltage pulse serves to turn on and turn off transistor 1200. In doing so charge is injected via Cgs8 and Cgd8 to terminals 2200 and 2400, respectively. This injected charge can change the potential of terminals 2200 and 2400 which can in some applications modify, degrade and/or destroy information being transmitted through transmission gate 800. It also can lower the high impedance state of transmission gate 800.

In operation, the capacitors 1400 and 1600 are designed to provide charge compensation to the transistor 1200 for capacitive coupled current flowing therein by supplying or withdrawing and appropriate equal amount of capacitive coupled charge to terminals 220 and 240, respectively.

However, for perfect compensation, it is necessary that the control voltage pulse applied to the gate (terminal 2800) of the transistor 1200 be exactly equal in amplitude and opposite in phase to the control voltage pulse applied to the gates (terminal 3000) of capacitors 1400 and 1600. In practice it is difficult to achieve perfect compensation primarily because it is difficult to get the phases exactly opposite. In particular, any time delay introduced in the control voltage pulse by inverter 2000 causes an error in achieving exactly a 180 degree phase difference. Failure to get perfect compensation results in undesirable charge buildup in the transistor 1200 when it is turned off and so the impedance is not as high as might be desired. It also can change the potential of terminals 2200 and 2400 when transistor 1200 is turned on and thus modify, degrade and/or destroy information being transmitted through the transmission gate 800.

One advantage of transmission gate 800 over transmission gate 10 of FIG. 1. is that the complementary signals appearing on terminals 2800 and 3000 of transmission gate 800 cause transistors 1200, 1400 and 16000 to all be enabled (turned on) or disabled (turned off) and thus the capacitances of the three are better matched than in the transmission gate 10. This results in more accurate charge cancellation and thus improves performance.

Figure 9:
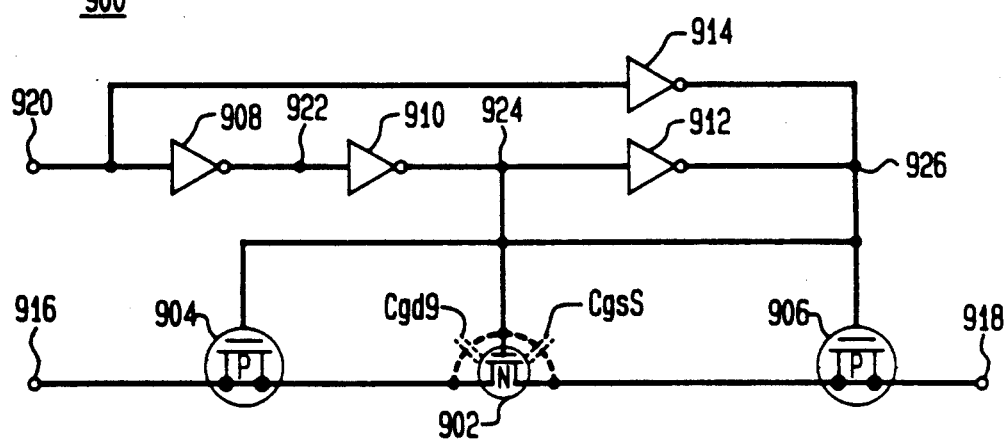
FIG. 9 is a circuit schematic of a transmission gate in accordance with another embodiment of the invention.

Referring now to FIG. 9, there is shown a transmission gate 900 in accordance with another embodiment of the present invention. Transmission gate 900 comprises an MOS transistor 902 connected as a switch, MOS transistors 904 and 906 which are each connected as two terminal capacitors with the drain and source of each shunted together and inverters 908, 910, 912 and 914. Since transistors 904 and 906 act as capacitors they may be denoted as capacitors 904 and 906. Transmission gate 900 controls a transmission path from a first input-/output terminal 916, which is coupled to the drain and source of transistor 904 and to the drain of transistor 902, to a terminal 918 which is coupled to the drain and source of transistor 906 and to the source of transistor 902. For illustrative purposes transistor 902 is an n-channel MOS transistor and transistors 904 and 906 are p-channel MOS transistors. It is to be appreciated that with transistor 902 being an n-channel transistor that transistors 904 and 906 could also be n-channel MOS transistors. Still further, transistor 902 could be a p-channel MOS transistor with transistors 904 and 906 being either n-channel or p-channel MOS transistors.

A control input signal terminal is coupled to inputs of inverters 908 and 914 and to a terminal 920. An output of inverter 908 is coupled to an input of inverter 910 and to a terminal 922. An output of inverter 910 is coupled to the gate of transistor 902, to an input of inverter 912 and to a terminal 924. Outputs of inverters 912 and 914 are coupled together and are coupled to the gates of transistors 904 and 906 and to a terminal 926. Capacitors Cgd9 and Cgs9, shown in dashed lines, are the parasitic gate to drain and gate to source capacitances, respectively, of transistor 902. Cgd9 and Cgs9 are typically equal because of the symmetrical structure of a typical MOS transistor.

The dimensions of transistors 904 and 906 are typically selected to be identical to those of transistor 902 except that the channel width of each is one-half of that of the channel of transistor 902. This to a large order makes the capacitance of transistor 904 equal to that of Cgd9 and the capacitance of transistor 906 equal to Cgs9.

Transmission gate 900 functions in a similar fashion to transmission gate 800 of FIG. 8 with one exception. When a control signal applied to terminal 920 makes a transition from a "1" potential level to a "0" potential level, inverter 914 tries to cause terminal 926 to make a transition from a "0" to a "1". The time delays associated with each of inverters 908, 910, 912 and 914 are typically approximately equal. Because of the time delays associated with inverters 908, 910 and 912, the potential of terminal 926 tends during the transition to be held at the "0" level by inverter 912. The net result is that the potential of terminal 926 rises to a level about midway between the "1" and "0" potential levels and stays at that mid-potential level for the delay time associated with inverters 908, 910 and 912, and then rises to the "1" potential level. The reverse happens when a control signal applied to terminal 920 makes a transition from a "0" to a "1". The net result of this two step potential level change of terminal 926 is that the injecting of charge into or from terminals 916 and 918 is a two step process with a time delay. This provides improved time-averaging compensation as compared to transmission gate 10 of FIG. 1.

It should be evident that various changes may be made in the embodiments depicted without departing from the spirit and scope of the invention. For example, other arrangements may be devised for achieving control pulses having the necessary phase relations for the operation described. Still further, the inverters can be a variety of other combinations other than a CMOS inverter. Still further, in some applications a relatively low impedance signal of voltage source (not shown) to coupled to input terminal 118 and a relatively high impedance load (not shown)is coupled to output terminal 120. Accordingly, most charge injected onto terminal 118 via Cgd4 of transistor 102 is dissipated into the low impedance source and does not accumulate on input terminal 118. Accordingly, transistors 104 and 106 can be eliminated in some applications.

What is claimed is:

1. Circuitry comprising:
    a first field effect transistor of a first conductivity type and having first and second output terminals and a gate terminal and having a first parasitic capacitance coupled between the gate terminal and the first output terminal and having a second parasitic capacitance coupled between the gate terminal and the second output terminal;
    first, second, third and fourth capacitance means each having first and second terminals;
    first and second inverters each having an input terminal and an output terminal;
    a first circuitry input/output terminal being coupled to the first terminals of the first and second capacitive means and to the first output terminal of the first transistor;
    a second circuitry input/output terminal being coupled to the first terminals of the third and fourth capacitive means and to the second output terminal of the first transistor;
    the second terminals of the first and third capacitive means being coupled to the input terminal of the first inverter;
    the output terminal of the first inverter being coupled to the input terminal of the second inverter and to the gate terminal of the first transistor;
    the output terminal of the second inverter being coupled to the second terminals of the second and fourth capacitive means; and
    the first and second capacitive means have approximately equal capacitances with the sum of the two being approximately equal to the capacitance of the first parasitic capacitance; and
    the third and fourth capacitive means have approximately equal capacitances with the sum of the two being approximately equal to the capacitance of the second parasitic capacitance.

2. The circuitry of claim 1 wherein each one of the first, second, third and fourth capacitive means is a separate field effect transistor having two output terminals and a control terminal with the first terminal of each capacitive means being the two output terminals of its corresponding transistor and the second terminal of each capacitive means being the control terminal of its corresponding transistor.

3. The circuitry of claim 2 wherein all the transistors are MOS transistors and each of the four transistors which form the first, second, third and fourth capacitive means has the same geometry as the first transistor means except that the first transistor has a channel width which is four times as large as each of the other transistors.

4. The circuitry of claim 3 wherein the first transistor and the transistors which comprise the first, second, third and fourth capacitive means are all n-channel MOS transistors.

5. The circuitry of claim 3 wherein the first transistor and the transistors which comprise the first, second, third and fourth capacitive means are all p-channel MOS transistors.

6. The circuitry of claim 3 wherein the first transistor is of first conductivity type and the transistors which comprise the first, second third and fourth capacitive means are of the opposite conductivity type.

7. The circuitry of claim 1 further comprising:
    a second field effect transistor of a second conductivity type and having first and second output terminals and a control terminal and a third parasitic capacitance coupled between the control terminal and the first output terminal and having a fourth parasitic capacitance coupled between the control terminal and the second output terminal;
    the first and second transistors are both MOS transistors;
    fifth, sixth, seventh and eighth capacitance means each having first and second terminals;
    third and fourth inverters each having an input terminal and an output terminal;
    the first circuitry input/output terminal being coupled to the first terminals of the fifth and sixth capacitive means and to the first output terminal of the second transistor;
    the second circuitry input/output terminal being coupled to the first terminals of the seventh and eighth capacitive means and to the second output terminal of the second transistor;
    the second terminals of the fifth and seventh capacitive means being coupled to the input terminal of the third inverter;

the output terminal of the third inverter being coupled to the input terminal of the fourth inverter and to the gate terminal of the second MOS transistor;

the output terminal of the fourth inverter being coupled to the second terminals of the sixth and eighth capacitive means;

the fifth and sixth capacitive means have approximately equal capacitances and the sum of the two being approximately equal to the capacitance of the third parasitic capacitance; and the seventh and eighth capacitive means have approximately equal capacitances and the sum of the two being approximately equal to the capacitance of the fourth parasitic capacitance;

the first, second third and fourth capacitive means are each a separate MOS transistor with the first terminal of each capacitive means being the two output terminals of the transistor comprising same and the second terminal of each capacitive means being the gate terminal of the transistor comprising same;

the fifth, sixth, seventh and eighth capacitive means are each a separate MOS transistor with the first terminal of each capacitive means being the two output terminals of the transistor comprising same and the second terminal of each capacitive means being the gate terminal of the transistor comprising same;

the first transistor and each of the four transistors which comprise the first, second, third and fourth capacitive means have the same geometry except that the first transistor has a channel width which is four times as large as that of the other four transistors that form the first, second, third and fourth capacitance means; and the second transistor and each of the four transistors which comprise the fifth, sixth, seventh and eighth capacitive means have the same geometry except that the second transistor has a channel width which is four times as large as that of the other four transistors that form the fifth, sixth, seventh and eighth capacitance means.

8. The circuitry of claim 7 wherein:

the first transistor and the transistors which comprise the first, second, third and fourth capacitive means are all n-channel MOS transistors; and the second transistor and the transistors which comprise the fifth, sixth, seventh and eighth capacitive means are all p-channel MOS transistors.

9. The circuitry of claim 7 wherein:

the first transistor is an n-channel MOS transistor and the transistors which comprise the first, second, third and fourth capacitive means are all p-channel MOS transistors; and the second transistor is a p-channel MOS transistor and the transistors which comprise the fifth, sixth, seventh and eighth capacitive means are all n-channel MOS transistors.

10. A transmission gate comprising:

a first MOS transistor of a first conductivity type and having a source, a drain and a gate and having a first parasitic capacitance coupled between the gate and drain, and having a second parasitic capacitance coupled between the gate and source;

first, second, third and fourth capacitors each having first and second terminals;

the second terminals of the first and second capacitors being coupled together and being coupled to the drain of the first MOS transistor;

the second terminals of the third and fourth capacitors being coupled to the source of the first MOS transistor;

means for applying a first control signal to the first terminals of the first and third capacitors, a delayed and inverted version of the first control signal to the gate of the first MOS transistor, and a further delayed version of the first control signal to the first terminals of the second and fourth capacitors;

the sum of the capacitances of the first and second capacitors being approximately equal to the capacitance coupled between the gate and drain of the first MOS transistor; and the sum of the capacitances of the third and fourth capacitors being approximately equal to the capacitance coupled between the gate and source of the first MOS transistor.

11. The transmission gate of claim 10 in which each of the capacitors is a separate MOS transistor in which the gate serves as a first terminal of the capacitor and the drain and source are coupled together and serve as a second terminal of the capacitor.

12. The transmission gate of claim 11 in which the width of the channel of each of the MOS transistors comprising the capacitors is one quarter the width of the channel of the first MOS transistor.

13. The transmission gate of claim 12 is which each of the transistors is of the n-channel type.

14. The transmission gate of claim 12 is which each of the transistors is of the p-channel type.

15. The transmission gate of claim 12 in which the first MOS transistor is an n-channel MOS transistor and the transistors which form the four capacitors are each a p-channel MOS transistor.

16. The transmission gate of claim 12 in which the first MOS transistor is a p-channel MOS transistor and the transistors which form the four capacitors are each an n-channel MOS transistor.

17. The transmission gate of claim 10 in which the means for applying the control pulses comprises first and second inverters with an input of the first inverter being coupled to the first terminals of the first and third capacitors, an output of the first inverter being coupled to the gate of the first MOS transistor and to an input of the second inverter, and with an output of the second inverter being coupled to the first terminals of the second and fourth capacitors.

18. The transmission gate of claim 17 in which each of the first and second inverters introduces the same delay to a control pulse passing therethrough.

19. The gate of claim 18 in which each of the transistors having the source and drain thereof coupled together to form a capacitor has a channel width equal to one-quarter the channel width of the first transistor and having essentially the same other parameters as the first transistor.

20. A transmission get comprising:

a first MOS transistor of a first conducting type having a source, a drain and a gate, having a first parasitic capacitance coupled between the gate and drain, and having a second parasitic capacitance coupled between the gate and source;

first, second, third and fourth capacitors each capacitor being formed of a separate MOS transistor having a source, drain and gate the gate serving as a first terminal of the capacitor and the drain and source being coupled together and serving as a second terminal of the capacitor;

the second terminals of the first and second capacitors being coupled together and being coupled to the drain of the first MOS transistor;

the second terminals of the third and fourth capacitors being coupled to the source of the first MOS transistor;

first and second inverters each having an input terminal and an output terminal;

a transmission gate control terminal being coupled to the first terminals of the first and third capacitors and to the input terminal of the first inverter;

the output terminal of the first inverter being coupled to the gate of the first MOS transistor and to the input terminal of the second inverter;

the output terminal of the second inverter being coupled to the first terminals of the second and fourth capacitors;

the sum of the capacitances of the first and second capacitors being approximately equal to the capacitance coupled between the gate and drain of the first MOS transistor; and the sum of the capacitance of the third and fourth capacitors being approximately equal to the capacitance coupled between the gate and source of the first MOS transistor.

21. The transmission gate of claim 20 wherein the first and second capacitors have approximately equal capacitances and the third and fourth capacitors have approximately equal capacitances.

22. The transmission gate of claim 21 in which the width of each channel of the transistors which are configured to be the four capacitors is one quarter the width of the first transistor.

23. The transmission gate of claim 22 wherein the first transistor and the transistors which are the four capacitors are all n-channel transistors.

24. The transmission gate of claim 22 wherein the first MOS transistor and the transistors which are the four capacitors are all p-channel transistors.

25. The transmission gate of claim 22 wherein the first transistor is of the one conductivity type and the transistors which form the capacitors are of the opposite conductivity type.

26. The transmission gate of claim 25 wherein the first transistor is an n-channel MOS transistor and the transistors which form the capacitors are all p-channel transistors.

27. The transmission gate of claim 25 wherein the first transistor is a p-channel MOS transistor and the transistors which form the capacitors are all n-channel transistors.

28. Circuitry comprising:

a first MOS transistor of a first conductivity type and having first and second output terminals and a gate terminal and having a first parasitic capacitance coupled between the gate terminal and the first output terminal and having a second parasitic capacitance coupled between the gate terminal and the second output terminal;

second and third MOS transistors of the opposite conductivity type of the first MOS transistor with each having first and second output terminals and a gate terminal and each having a first parasitic capacitance coupled between the gate terminal and the first output terminal thereof and having a second parasitic capacitance coupled between the gate terminal and the second output terminal thereof;

the two output terminals of the second transistor being coupled together and being coupled to the first output terminal of the first transistor and to a first input/output terminal of the circuitry;

the two output terminals of the third transistor being coupled together and being coupled to the second output terminal of the first transistor and to a second input/output terminal of the circuitry; and a first inverter having an input terminal and an output terminal with the input terminal being coupled to the gate terminal of the first transistor and to a control terminal of the circuitry and with the output terminal being coupled to the gate terminals of the second and third transistors;

the capacitance between the gate terminal and the output terminals of the second transistor being approximately equal to the first parasitic capacitance; and the capacitance between the gate terminal and the first and second output terminals of the third MOS transistor being approximately equal to that of the second parasitic capacitance.

29. The circuitry of claim 28 wherein the first, second and third transistors are n-channel, p-channel and p-channel MOS transistors, respectively.

30. The circuitry of claim 28 wherein the first, second and third transistors are p-channel, n-channel and n-channel MOS transistors, respectively.

31. Circuitry comprising:

a first field effect transistor of a first conductivity type and having first and second output terminals and a control terminal and having a first parasitic capacitance coupled between the control terminal and the first output terminal and having a second parasitic capacitance coupled between the control terminal and the second output terminal;

first and second capacitance means each having first and second terminals;

first and second inverters each having an input terminal and an output terminal;

a first circuitry input/output terminal being coupled to the first output terminal of the first transistor;

a second circuitry input/output terminal being coupled to the first terminals of the first and second capacitive means and to the second output terminal of the first transistor;

the second terminal of the first capacitive means being coupled to the input terminal of the first inverter;

the output terminal of the first inverter being coupled to the input terminal of the second inverter and to the control terminal of the first transistor;

the output terminal of the second inverter being coupled to the second terminal of the second capacitive means; and the first and second capacitive means have approximately equal capacitances with the sum of the two being approximately equal to the capacitance of the second parasitic capacitance.

32. The circuitry of claim 31 wherein each one of the first and second capacitive means is a separate field effect transistor having first and second output terminals and a control terminal; with the first terminal of each capacitive means being the two output terminals of its corresponding transistor and the second terminal of each capacitive means being the control terminal of its corresponding transistor.

33. The circuitry of claim 32 wherein all the transistors are MOS transistors and each of the transistors which form the first and second capacitive means have the same geometry as the first transistor except that the first transistor has a channel width which is four times as large as each of the other transistors.

34. The circuitry of claim 33 wherein the first transistor and the transistors which comprise the first and second capacitive means are all n-channel MOS transistors.

35. The circuitry of claim 33 wherein the first transistor and the transistors which comprise the first and second capacitive means are all p-channel MOS transistors.

36. The circuitry of claim 33 wherein the first transistor is of first conductivity type and the transistors which comprise the first and second capacitors are of the opposite conductivity type.

37. Circuitry comprising:
  a first field effect transistor of a first conductivity type and having first and second output terminals and a gate terminal and having a first parasitic capacitance coupled between the gate terminal and the first output terminal and having a second parasitic capacitance coupled between the gate terminal and the second output terminal;
  first and second capacitance means each having first and second terminals;
  first, second, third and fourth inverters each having an input terminal and an output terminal;
  a first circuitry input/output terminal being coupled to the first terminal of the first capacitive means and to the first output terminal of the first transistor;
  a second circuitry input/output terminal being coupled to the first terminal of the second capacitive means and to the second output terminal of the first transistor;
  the second terminals of the first and second capacitive means being coupled to the outputs of the third and fourth inverters;
  the output terminal of the first inverter being coupled to the input terminal of the second inverter;
  the output terminal of the second inverter being coupled to the gate terminal of the first transistor and to the input of the third inverter;
  the first capacitive means having a capacitance approximately equal to the capacitance of the first parasitic capacitance; and
  the second capacitive means having a capacitance approximately equal to the capacitance of the second parasitic capacitance.

38. The circuitry of claim 37 wherein the first and second capacitive means are each a separate field effect transistor having two output terminals and a gate terminal, the first terminal of each capacitive means being the two output terminals of its corresponding transistor, and the second terminal of each capacitive means being the gate terminal of its corresponding transistor.

39. The circuitry of claim 38 wherein all the transistors are MOS transistors and each of the transistors which form the first and second capacitive means has the same geometry as the first transistor except that the first transistor has a channel width which is two times as large as each of the other transistors.

40. The circuitry of claim 39 wherein the first transistor and the transistors which comprise the first and second capacitive means are all n-channel MOS transistors.

41. The circuitry of claim 40 wherein the first transistor and the transistors which comprise the first and second capacitive means are all p-channel MOS transistors.

42. The circuitry of claim 41 wherein the first transistor is of first conductivity type and the transistors which comprise the first and second capacitive means are of the opposite conductivity type.

* * * * *